(12) United States Patent
Steimle et al.

(10) Patent No.: US 7,838,363 B2
(45) Date of Patent: Nov. 23, 2010

(54) METHOD OF FORMING A SPLIT GATE NON-VOLATILE MEMORY CELL

(75) Inventors: Robert F. Steimle, Austin, TX (US); Gowrishankar L. Chindalore, Austin, TX (US); Matthew T. Herrick, Cedar Park, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 443 days.

(21) Appl. No.: 11/931,376

(22) Filed: Oct. 31, 2007

(65) Prior Publication Data

US 2009/0111229 A1 Apr. 30, 2009

(51) Int. Cl.
*H01L 21/00* (2006.01)
(52) U.S. Cl. .................. 438/267; 438/260; 438/257
(58) Field of Classification Search .......... 438/260, 438/267, 257
See application file for complete search history.

(56) References Cited

U.S. PATENT DOCUMENTS

| | | | | |
|---|---|---|---|---|
| 5,408,115 | A * | 4/1995 | Chang ................. | 257/324 |
| 5,824,584 | A * | 10/1998 | Chen et al. ............ | 438/267 |
| 5,969,383 | A * | 10/1999 | Chang et al. .......... | 257/316 |
| 6,017,793 | A * | 1/2000 | Oyama ................ | 438/258 |
| 6,816,414 | B1 * | 11/2004 | Prinz .................. | 365/185.29 |
| 7,046,552 | B2 | 5/2006 | Chen et al. | |
| 7,132,329 | B1 * | 11/2006 | Hong et al. ........... | 438/257 |
| 7,235,823 | B2 * | 6/2007 | Hong et al. ........... | 257/213 |
| 7,294,878 | B2 * | 11/2007 | Tanaka et al. ......... | 257/296 |
| 7,341,914 | B2 * | 3/2008 | Prinz et al. ........... | 438/260 |
| 7,514,321 | B2 * | 4/2009 | Mokhlesi et al. ....... | 438/259 |
| 7,550,348 | B2 * | 6/2009 | Hong et al. ........... | 438/257 |
| 7,557,008 | B2 * | 7/2009 | Rao et al. ............. | 438/288 |
| 7,575,973 | B2 * | 8/2009 | Mokhlesi et al. ....... | 438/259 |
| 7,700,439 | B2 | 4/2010 | Prinz et al. | |
| 2005/0176202 | A1 | 8/2005 | Hisamoto et al. | |
| 2005/0212036 | A1 * | 9/2005 | Tanaka et al. ......... | 257/316 |
| 2005/0218442 | A1 * | 10/2005 | Hieda ................. | 257/306 |
| 2007/0020849 | A1 * | 1/2007 | Hong et al. ........... | 438/257 |
| 2007/0054452 | A1 * | 3/2007 | Hong et al. ........... | 438/257 |
| 2007/0077705 | A1 * | 4/2007 | Prinz et al. ........... | 438/257 |

(Continued)

OTHER PUBLICATIONS

Restriction Requirement mailed Oct. 24, 2007 in U.S. Appl. No. 11/469,163.

(Continued)

*Primary Examiner*—Laura M Menz
(74) *Attorney, Agent, or Firm*—James L. Clingan, Jr.; Robert L. King

(57) ABSTRACT

A method forms a split gate memory cell by providing a semiconductor substrate and forming an overlying select gate. The select gate has a predetermined height and is electrically insulated from the semiconductor substrate. A charge storing layer is subsequently formed overlying and adjacent to the select gate. A control gate is subsequently formed adjacent to and separated from the select gate by the charge storing layer. The charge storing layer is also positioned between the control gate and the semiconductor substrate. The control gate initially has a height greater than the predetermined height of the select gate. The control gate is recessed to a control gate height that is less than the predetermined height of the select gate. A source and a drain are formed in the semiconductor substrate.

7 Claims, 8 Drawing Sheets

U.S. PATENT DOCUMENTS

| | | | |
|---|---|---|---|
| 2007/0152260 A1* | 7/2007 | Chou et al. | 257/315 |
| 2007/0218631 A1* | 9/2007 | Prinz et al. | 438/258 |
| 2007/0218633 A1* | 9/2007 | Prinz et al. | 438/267 |
| 2008/0176371 A1* | 7/2008 | Rao et al. | 438/257 |
| 2008/0188052 A1* | 8/2008 | Winstead et al. | 438/299 |
| 2008/0242028 A1* | 10/2008 | Mokhlesi et al. | 438/270 |
| 2008/0242034 A1* | 10/2008 | Mokhlesi et al. | 438/287 |
| 2009/0111229 A1* | 4/2009 | Steimle et al. | 438/261 |
| 2010/0029052 A1* | 2/2010 | Kang et al. | 438/261 |
| 2010/0059810 A1* | 3/2010 | Homma et al. | 257/324 |

OTHER PUBLICATIONS

Office Action mailed Feb. 5, 2008 in U.S. Appl. No. 11/469,163.
Office Action mailed Aug. 15, 2008 in U.S. Appl. No. 11/469,163.
Notice of Allowance mailed Dec. 16, 2008 in U.S. Appl. No. 11/469,163.

* cited by examiner

METHOD OF FORMING A SPLIT GATE NON-VOLATILE MEMORY CELL

CROSS-REFERENCE TO A RELATED APPLICATION

This application is related to U.S. patent application Ser. No. 11/469,163, filed Aug. 31, 2006, entitled "Self-Aligned Split Gate Memory Cell and Method of Making," naming Robert F. Steimle and Ko-Minh Chang as inventors, and assigned to the current assignee hereof.

BACKGROUND

1. Field

This disclosure relates generally to integrated circuit memories, and more specifically, to split gate non-volatile memory cells.

2. Related Art

Split gate non-volatile memory (NVM) cells have been found to be useful in providing more efficient programming because programming currents are greatly reduced. Also read can be accomplished more quickly due to keeping the control gate active continuously and using the select gate for selectively accessing cells. This has been found useful not just in floating gate but also in the use of other storage types such as nanocrystals which may also be characterized as nanoclusters in that they are quite small storage elements. A typical nanocluster may be 50 Angstroms in diameter. In this combination of nanocluster and split gate there is the advantage of reduced failures due to leakage from the storage layer of the NVM cell while also providing efficient programming and fast reads.

Thus there is a need for effective manufacturing techniques for split gate NVM cells.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a semiconductor device is formed to be a split gate non-volatile memory cell by reducing the control gate to a height lower than the select gate. The storage layer, which may be a layer of nanoclusters, is formed after the select gate is formed. The control gate is then formed over the nanocrystals. The control gate is then reduced in height so as to be lower than the select gate. A sidewall spacer is formed from the select gate to the control gate. Both the control gate and the select gate are silicided but there is no bridging of the silicide between them due to the height difference and the sidewall spacer. Thus the benefits of forming the select gate first is retained while the control gate is lower than the select gate which has the effect of providing more silicide on the select gate. For performance, the select gate has low resistance which is achieved with the high gate height and a fully silicided to surface. This is better understood by reference to the drawings and the following description.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
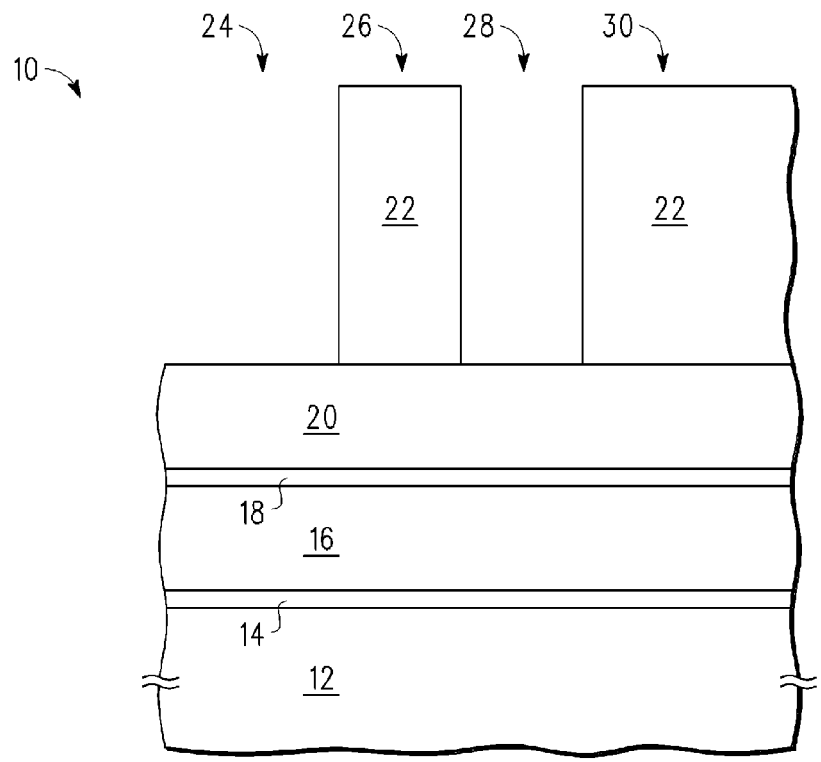
FIG. 1 is a cross section of a semiconductor device at a stage in processing according to an embodiment.

Shown in FIG. 1 is a semiconductor device 10 having a substrate 12, an oxide layer 14 over substrate 12, a semiconductor layer 16 over oxide layer 14, an oxide layer 18 over semiconductor layer 16, a nitride layer 20 over oxide layer 18, and a patterned photoresist layer 22 over nitride layer 20. Patterned photoresist layer 22 defines a source region 24 adjacent to a first portion of patterned photoresist layer 22, a select gate region 26 under the first portion of patterned photoresist layer 22, a control gate region 28 between the first portion of patterned photoresist layer 22 and a second portion of patterned photoresist layer 22, and a drain region 30 under the second portion of patterned photoresist layer 22. Oxide layer 14 is used as a gate dielectric for the select gate. Semiconductor layer 16 is preferably polysilicon so as to be useful for the select gate and may be about 1500 Angstroms thick. Oxide layer 18 may be about 80 angstroms thick. Nitride layer 20 may be about 1000 Angstroms.

Figure 2:
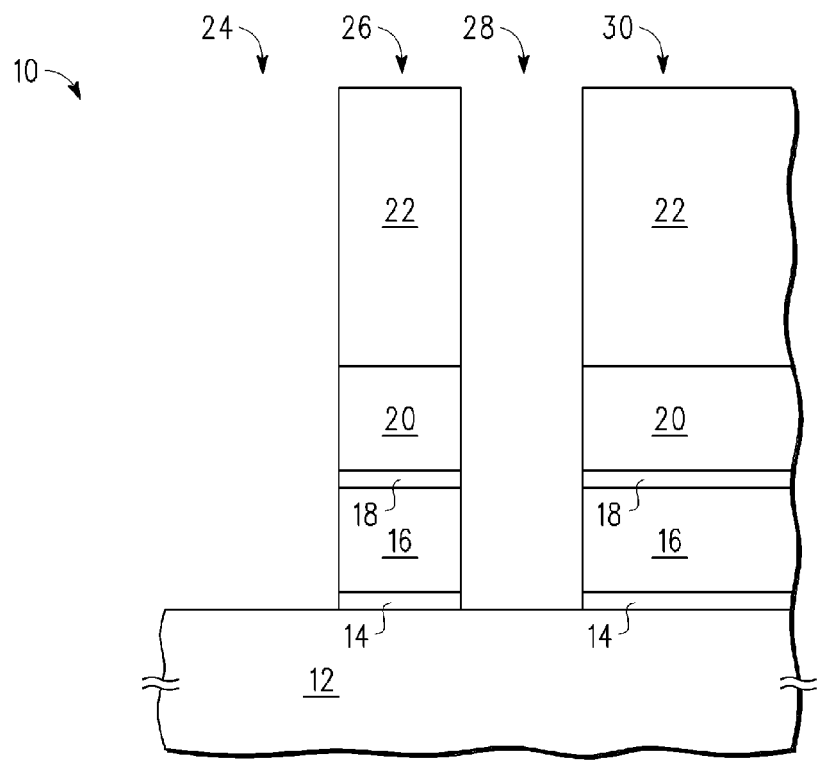
FIG. 2 is cross section of the semiconductor device of FIG. 1 at a subsequent stage in processing.

Shown in FIG. 2 is semiconductor device 10 after etching through nitride layer 20, oxide layer 18, semiconductor layer 16, and oxide layer 14 using the first and second portions of photoresist layer 22 as a mask. This etch exposes substrate 12 in source region 24 and control region 28. The remaining portion of semiconductor layer 16 in select gate region 26 will be the select gate of the split gate non-volatile memory (NVM) cell that is in the process of being made and may referenced as select gate 16. The portion of semiconductor layer 16 in drain region 30 will be removed prior to completion of the split gate NVM cell. Because this process is what is sometimes referenced as a select-gate-first process, nanocrystals have not been deposited so they do not have to be removed in the area adjacent to substrate 12. Nanocrystals, which will be used for charge storage, can be adversely impacted at the interface between where they are removed and where they are to remain. For example, an etch of nanocrystals on the substrate tends to undercut the adjacent charge storage layer. This undercut location is typically the location where the programming is most efficient. Thus losing some the storage capability at this location is particularly detrimental to efficient programming. These problems are avoided by forming select gate 16 prior to deposition of the nanocrystals.

Figure 3:
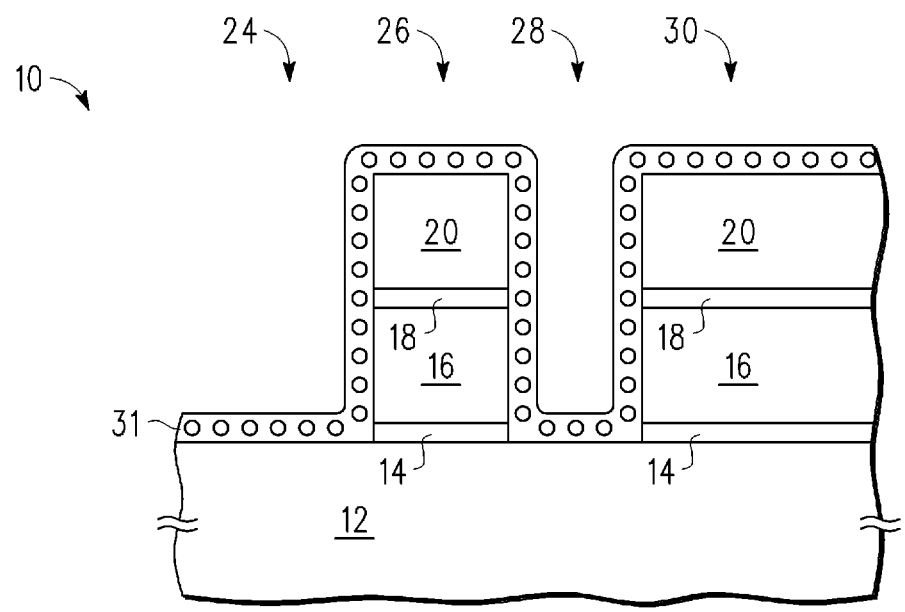
FIG. 3 is cross section of the semiconductor device of FIG. 2 at a subsequent stage in processing.

Shown in FIG. 3 is semiconductor device 10 after formation of a nanocluster layer 31 which may comprise polysilicon nanocrystals. Nanocluster layer 31 may be about 200 Angstroms thick. Nanocluster layer 31, comprises an underlying insulating layer, a plurality of nanoclusters on the underlying insulating layer, and another insulating layer around and over the nanoclusters. Note that the nanocrystals that are used for storage are in control gate region 28. The nanocrystals in source region 24, which will be removed, do not adjoin any nanocrystals that are under the control gate. Thus, the removal of the nanocrystals in source region 24 will not adversely impact nanocrystals that are used for charge storage.

Figure 4:
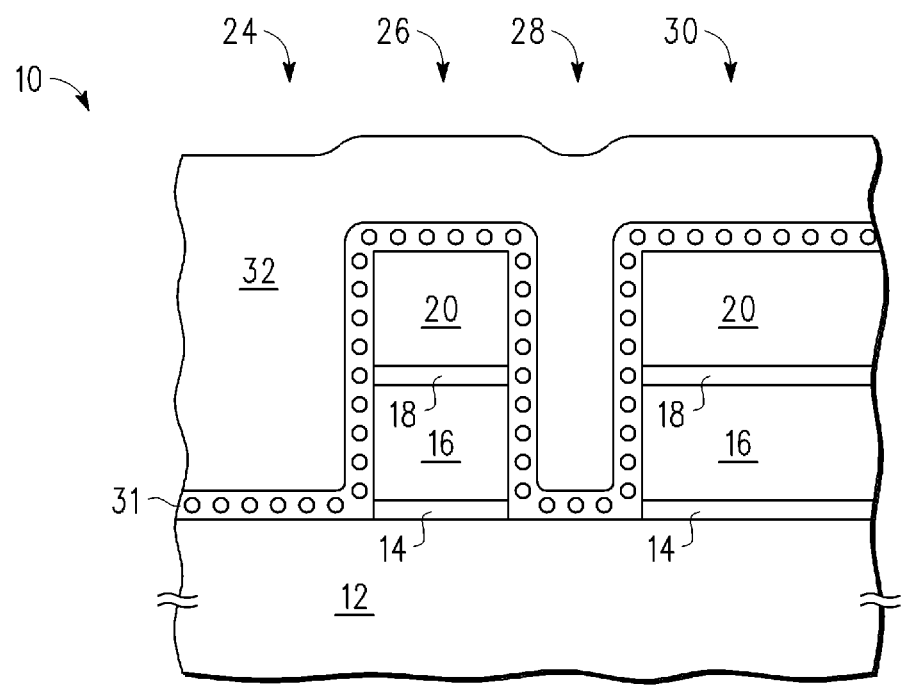
FIG. 4 is cross section of the semiconductor device of FIG. 3 at a subsequent stage in processing.

Shown in FIG. 4 is semiconductor device 10 after deposition of a semiconductor layer 32 which may be polysilicon. This deposition is of sufficient thickness to at least be above the height of nitride layer 20. In this case, semiconductor layer 32 is above nanocrystal layer 32 over nitride layer 20.

Figure 5:
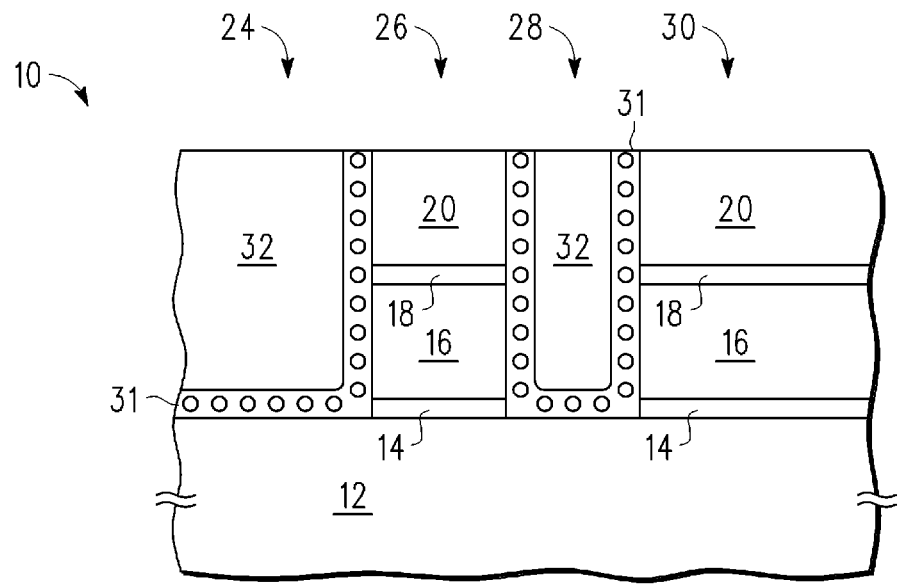
FIG. 5 is cross section of the semiconductor device of FIG. 4 at a subsequent stage in processing.

Shown in FIG. 5 is semiconductor device 10 after performing a step of chemical mechanical polishing (CMP). This step of CMP planarizes semiconductor layer 32 and in the process removes the nanocrystals over nitride layer 20 and semiconductor layer 32 and the top surface of nitride layer 32 are coplanar.

Figure 6:
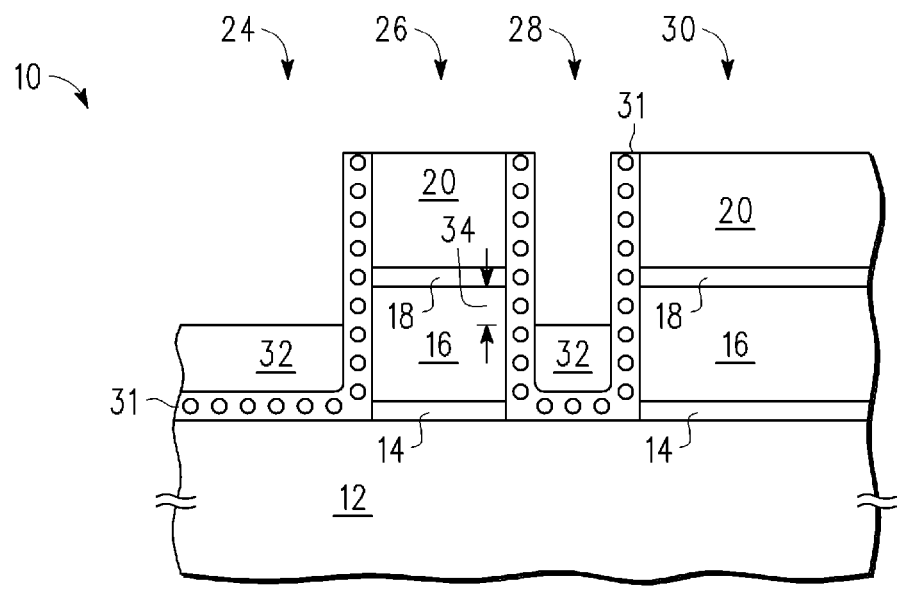
FIG. 6 is cross section of the semiconductor device of FIG. 5 at a subsequent stage in processing.

Shown in FIG. 6 is semiconductor device 10 after performing an etch back of semiconductor layer 32 in control gate region 28 to height below that of select gate 16 by an amount 34, which may be about 500 Angstroms. Also the total height of semiconductor 32 in control gate region 28 should be no more 1500 Angstroms in height. The remaining portion of polysilicon layer 32 in control gate region will be the control gate of the split gate NVM cell that is being formed and may be referenced as control gate 32. The portion of semiconductor layer 32 that is in source region 24 will be removed before completion of the split gate NVM cell that is being formed.

Figure 7:
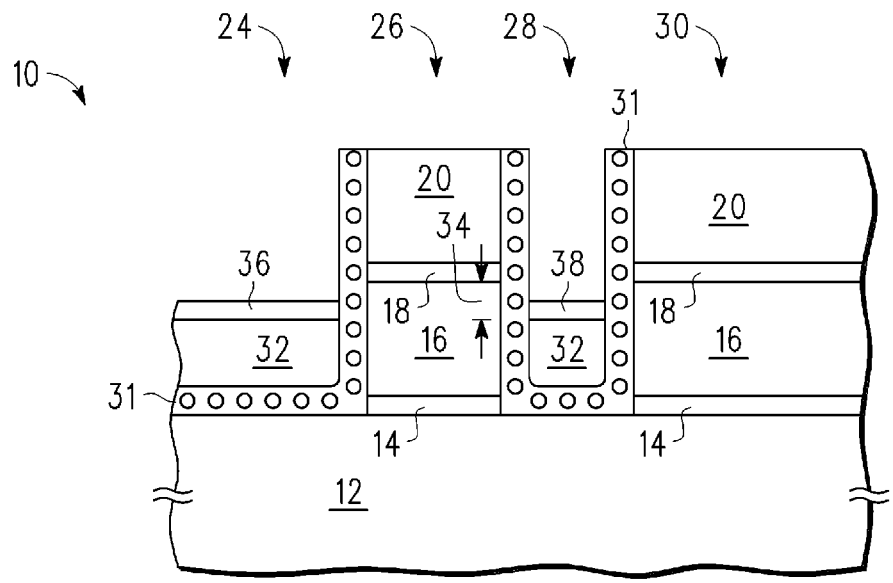
FIG. 7 is cross section of the semiconductor device of FIG. 6 at a subsequent stage in processing.

Shown in FIG. 7 is semiconductor device 10 after growing an oxide layer 36 on semiconductor layer 32 in source region 24 and an oxide layer 38 on semiconductor layer 32 in control gate region 28. Oxide layer 36 and 38 may be about 300 Angstroms thick. Any oxide growth on nitride layer 20 is minimal.

Figure 8:
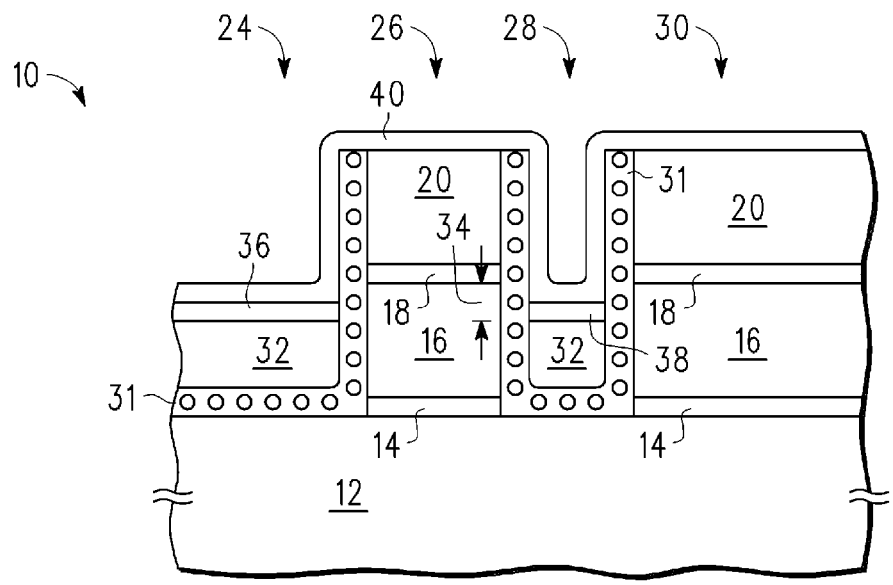
FIG. 8 is cross section of the semiconductor device of FIG. 7 at a subsequent stage in processing.

Shown in FIG. 8 is semiconductor device 10 depositing a hard mask layer 40 which may be polysilicon. Hard mask layer 40 may be about 500 Angstroms thick.

Figure 9:
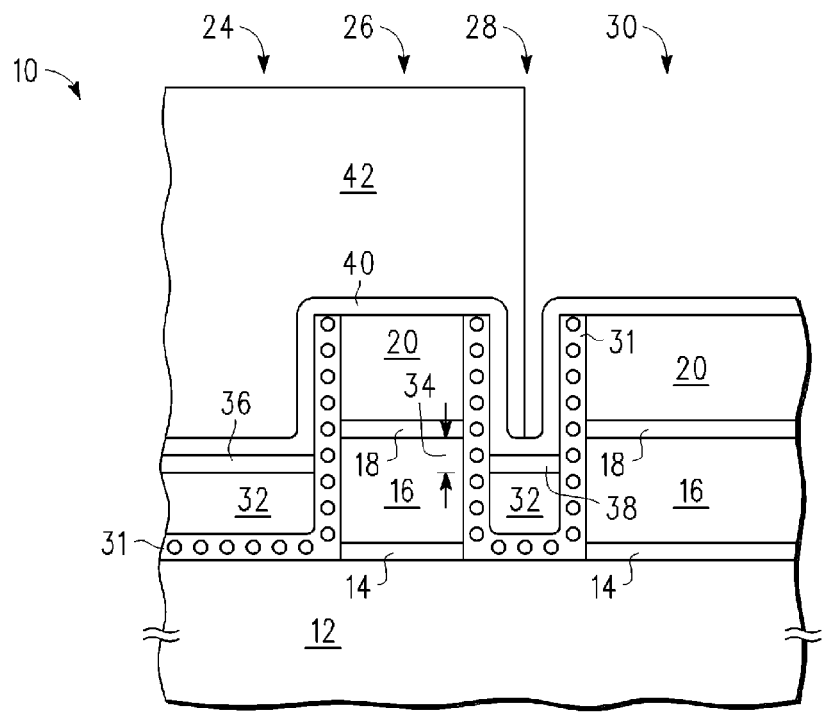
FIG. 9 is cross section of the semiconductor device of FIG. 8 at a subsequent stage in processing.

Shown in FIG. 9 is semiconductor device 10 after forming a patterned photoresist layer 42 that covers source region 24 and select gate region 26 and extends from select gate region 26 to cover a portion of control gate region 28. Drain region 30 is not covered by patterned photoresist layer 42.

Figure 10:
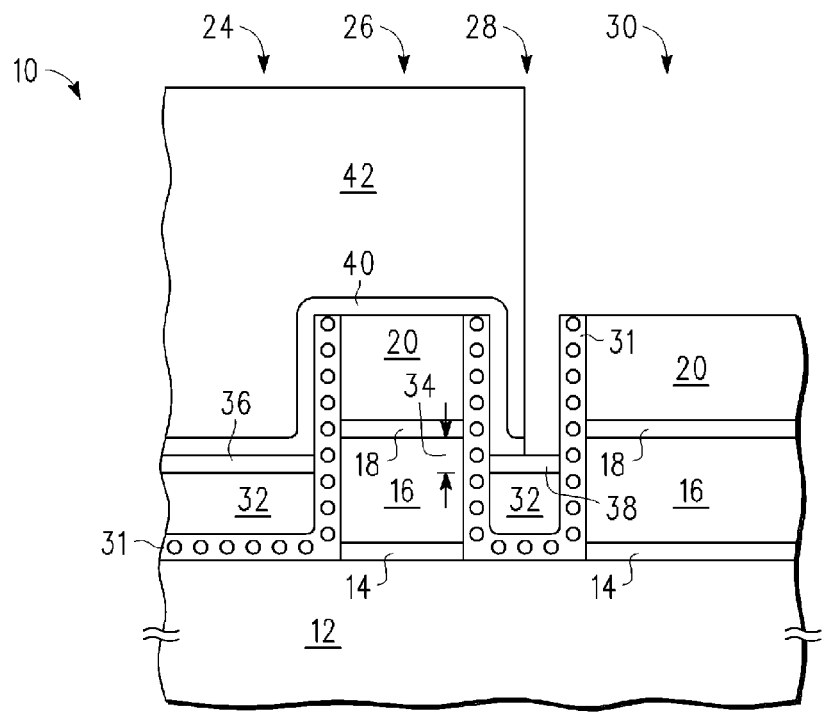
FIG. 10 is cross section of the semiconductor device of FIG. 9 at a subsequent stage in processing.

Shown in FIG. 10 is semiconductor device 10 after etching hard mask layer 40 using patterned photoresist layer 42 as a mask.

Figure 11:
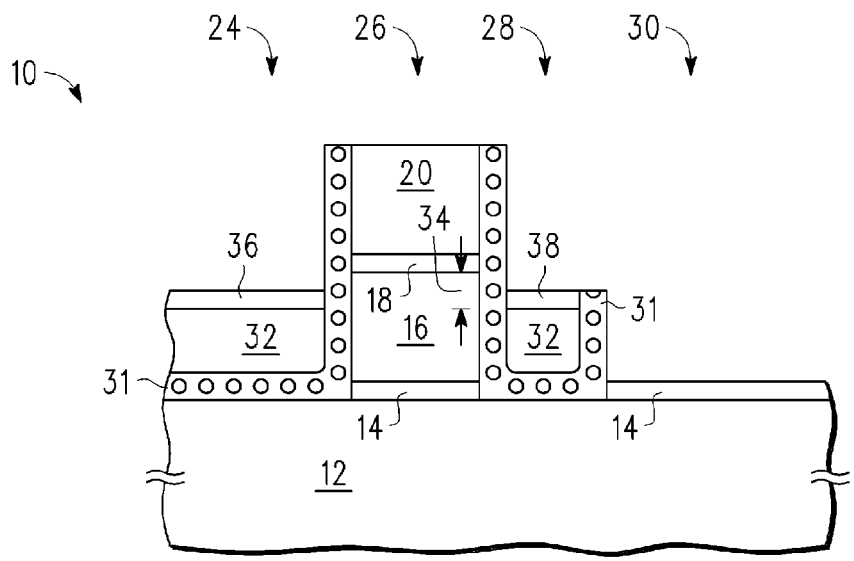
FIG. 11 is cross section of the semiconductor device of FIG. 10 at a subsequent stage in processing.

Shown in FIG. 11 is semiconductor device 10 after etching drain region 30 using hard mask 40 as a mask. A hot phosphoric acid etch process is used to remove the nitride layer. The result is the removal in drain region 20 of nitride layer 20, relatively thin oxide layer 18, and semiconductor layer 16. Hard mask layer 40 is removed during the removal of semiconductor layer 16. Oxide layer 38 is not completely removed during the removal of oxide layer 18.

Figure 12:
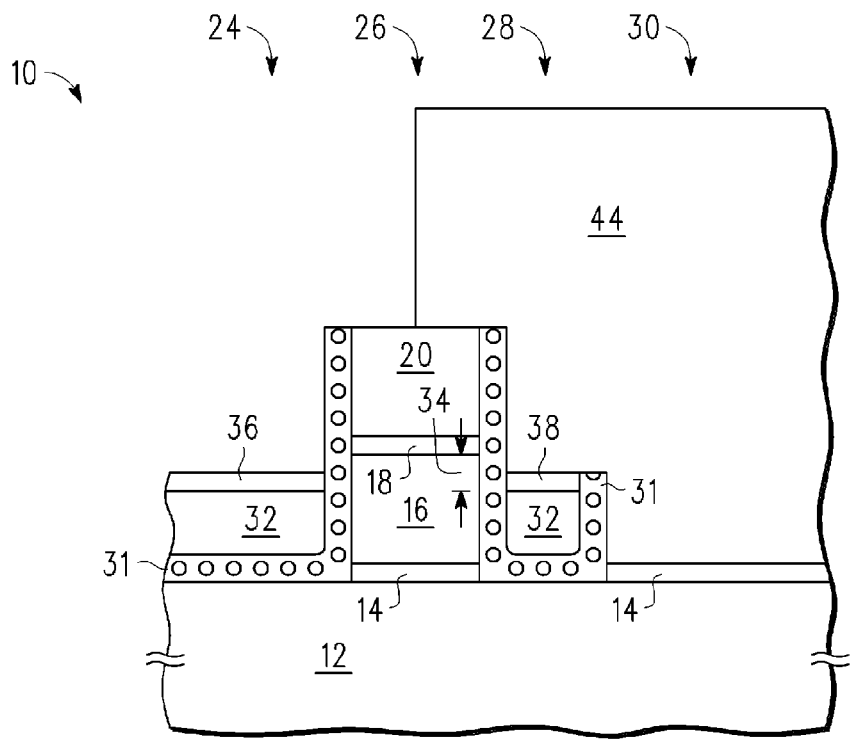
FIG. 12 is cross section of the semiconductor device of FIG. 11 at a subsequent stage in processing.

Shown in FIG. 12 is semiconductor device 10 after forming a patterned photoresist layer 44 over drain region 30 and control gate region and extending from control gate region 28 to cover a portion of select gate region 26. Source region 24 is not covered by patterned photoresist layer 44.

Figure 13:
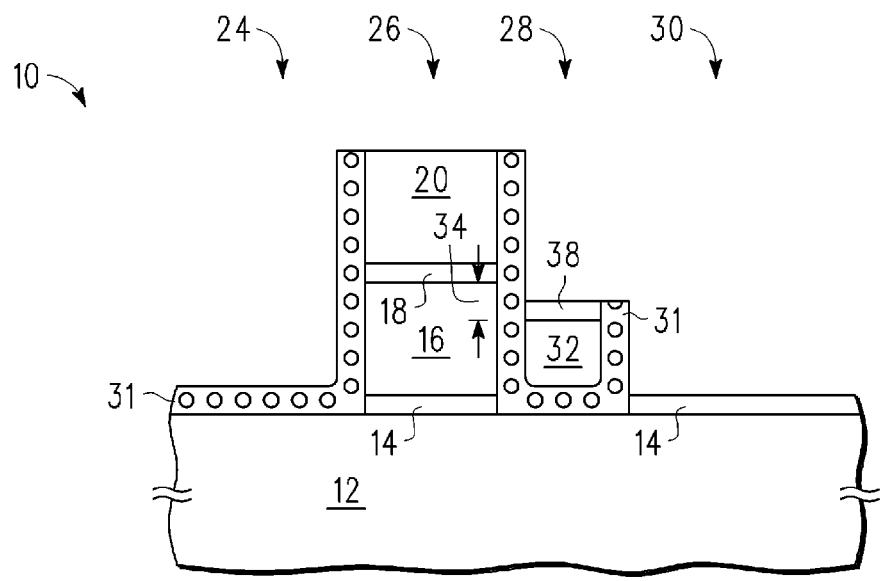
FIG. 13 is cross section of the semiconductor device of FIG. 12 at a subsequent stage in processing.

Shown in FIG. 13 is semiconductor device 10 after removing oxide layer 36 and semiconductor layer 16 in source region 24 using patterned photoresist layer 44 as a mask. In this process, patterned photoresist layer 44 is also removed. Nanocluster layer 31 in source region 24 on the surface of substrate 12 and along the sidewall of select gate 16 and nitride layer 20 remains. Nanocluster layer 31 also remains in control gate region 28 along both shown sidewalls of control gate 31 and along the side of nitride layer 20. Nanocluster layer is exposed on the sidewall of control gate 32 that is away from select gate 16.

Figure 14:
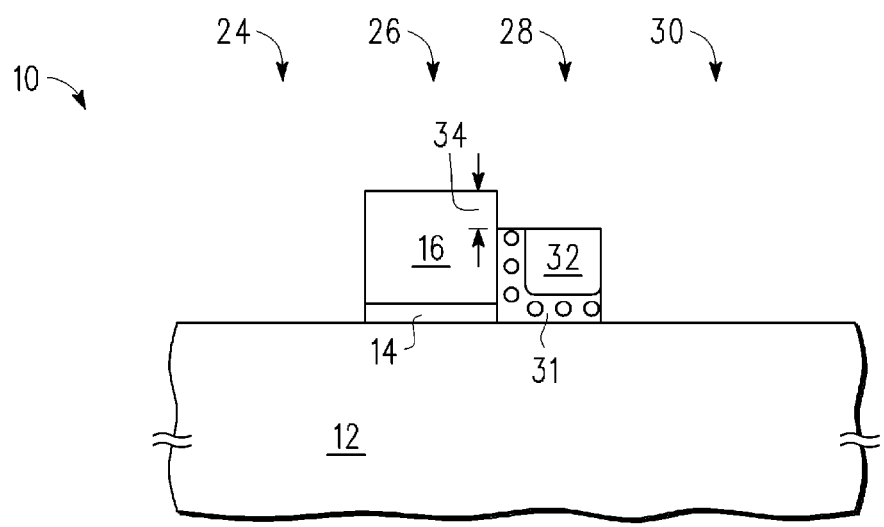
FIG. 14 is cross section of the semiconductor device of FIG. 13 at a subsequent stage in processing.

Shown in FIG. 14 is semiconductor device 10 after an etch that removes nanocluster layer 31 in source region 24 on substrate 12 and along one side of nitride layer 20, from the other side of nitride layer 20 in control gate region 28, and from the sidewall of control gate 32 away from select gate 16. This etch also removes oxide layer 18 and oxide layer 14. Although this is an etch adjoining nanocrystals used for storage, this is by an etch that removes nanocrystals on a sidewall not on the substrate on the same level as the nanocrystals used for charge storage, Further, the presence of oxide layer 14 helps to protect the nanocrystals under control gate 32 during the etch process. A further etch removes nitride layer 20.

Figure 15:
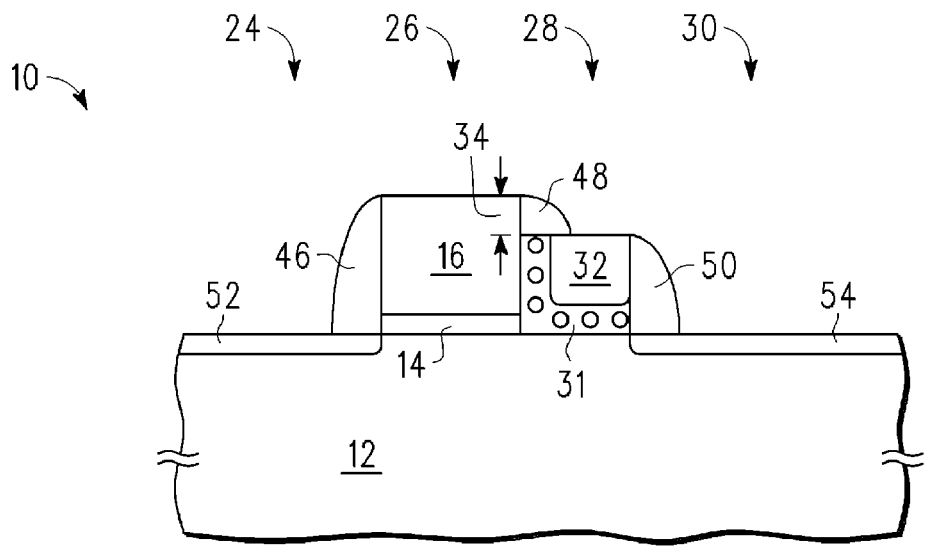
FIG. 15 is cross section of the semiconductor device of FIG. 14 at a subsequent stage in processing.

Shown in FIG. 15 is semiconductor device 10 after an extension implant forming source region 52 and drain region 54 and after forming sidewall spacer 46 in source region 24 along the sidewall of select gate 16, a sidewall spacer 50 on the exposed sidewall of control gate 32, and a sidewall spacer 48 from a sidewall of select gate 16 to cover a top portion control gate 32. Amount 34 of select gate 16 being above control gate 32 allows sidewall spacer to cover the control gate instead of the select gate. The result is that sidewall spacer 48, which is useful in separating the control gate and select gate for subsequent siliciding, covers a portion of the control gate instead of the select gate.

Figure 16:
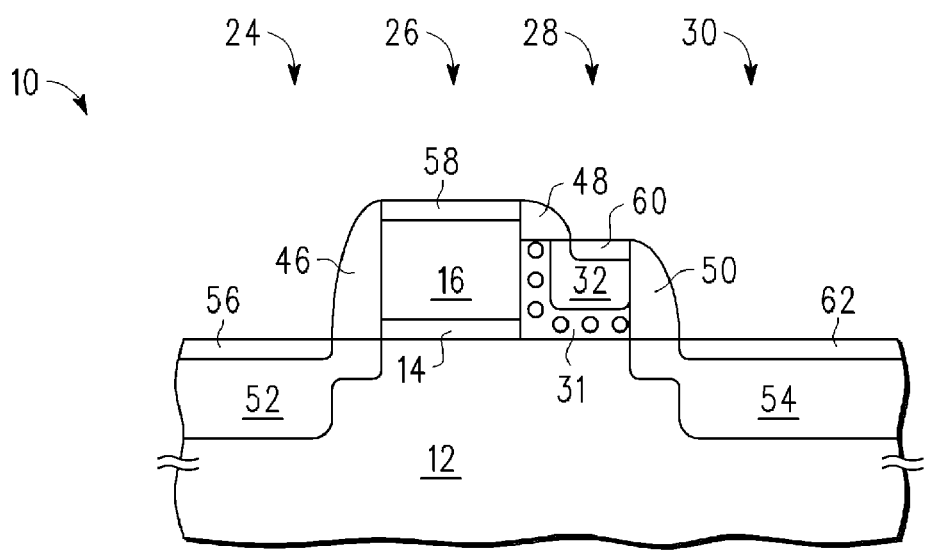
FIG. 16 is cross section of the semiconductor device of FIG. 15 at a subsequent stage in processing.

Shown in FIG. 16 is semiconductor device 10 as a completed split gate NVM cell in which heavy source/drain implants have been performed using sidewall spacers 46 and 50 as masks and a silicide region 56 has been formed in top surface of source 52, a silicide region 58 has been formed in a top surface of select gate 16, a silicide region 60 has been formed in a top surface of control gate 32, and a silicide region 62 has been formed in a top surface of drain 54.

In a split gate read operation, the control gate is held in an active state, and the select gate receives the signal which actually results in the NVM cell providing an output. Thus, the speed of operation is dependent upon the select gate while the control gate has no or minimal effect on speed. Thus, it is more important to have the select gate being highly conductive. In the NVM cell of FIG. 16, sidewall spacer 48 covers a portion of control gate so that only a portion is silicided; the portion not covered by sidewall spacer 48. By having select gate 16 with a greater height than control gate 32, select gate 16 has its entire top surface exposed for silicidation. The result is that select gate 16 is fully silicided which provides more benefit than having the control gate fully silicided. The method for achieving this requires minimal additional processing and does not require an extra mask step. Further, problems associated with having to remove nanocrystals from a substrate in an area where the nanocrystals being removed are adjacent to the nanocrystals to be used for charge storage are avoided. For a given height of select gate 16, which will be a height sufficient to achieve the necessary read access time, the recessing of control gate 32 results in a reduced height for the split gate NVM cell. That is, if the control gate is not recessed, the height of the split gate NVM cell is the higher of the control gate and the select gate so that recessing the control gate results in the height of the split gate NVM cell being that of the select gate. This reduction in the height of the control gate results in a lower topography which simplifies processing of the device at future steps. For example, this lower topography provides for better protection at subsequent lithography steps where a thinner resist will be able to protect the split-gate flash bitcell from subsequent etch processes used to form other devices used in a system on a chip. Further, the lowering of the topography results in reduced film thicknesses at subsequent layers which simplifies and improves the formation of connections between devices.

By now it should be appreciated that there has been provided of forming a split gate memory cell. The memory includes providing a semiconductor substrate. The method further includes providing a first dielectric layer overlying the semiconductor substrate. The method further includes providing a layer of select gate material overlying the first dielectric layer. The method further includes providing a second dielectric layer overlying the layer of select gate material. The method further includes providing a third dielectric layer overlying the second dielectric layer. The method further includes providing a patterned mask material overlying the third dielectric layer to mask a select gate region and expose an immediately adjacent control gate region, the patterned mask material defining a region for a source and a drain in the semiconductor substrate. The method further includes removing the first dielectric layer, the layer of select gate material, the second dielectric layer and the third dielectric layer in the control gate region. The method further includes forming a charge storage layer on exposed surfaces. The method further includes forming a layer of control gate material. The method further includes planarizing the layer of control gate material to expose the third dielectric region in the select gate region and thereby remove the charge storage layer from an upper surface of the select gate region to expose the select gate material and the control gate material. The method further includes removing a portion of the control gate material to recess a height of the control gate material and forming a differential in height between the control gate material and the select gate material, said removing causing the select gate material to have a greater height than the control gate material. The method further includes removing a second portion of the charge storage layer to leave the charge storage layer between the control gate material and both the select gate material and the semiconductor substrate. The method further includes forming a source and a drain in the semiconductor substrate by removing layers directly overlying the semiconductor substrate in source and drain regions adjacent the control gate material and the select gate material and performing an ion implant to complete formation of the split gate memory cell. The method may further include forming a sidewall spacer from an edge of a top surface of the select gate material to a top surface of the control gate material, the sidewall spacer formed overlying a portion of the charge storage layer and providing electrical isolation between the select gate material and the control gate material. The method may further include forming the charge storage layer as a layer of nanoclusters. The forming the charge storage layer of the method may further include forming a tunnel dielectric layer; forming the layer of nanoclusters overlying the tunnel dielectric; and forming a fourth dielectric layer overlying the layer of nanoclusters. The forming the layer of control gate material may further comprise forming a portion of the layer of control gate material overlying the region for the source in the semiconductor substrate; reducing the portion of the layer of control gate material overlying the region for the source in the semiconductor substrate to the height of the control gate material when removing the portion of the control gate material to recess the height to be no greater than 1,500 Angstroms; and subsequently completely removing the portion of the layer of control gate material overlying the region for the source in the semiconductor substrate. The method may further include forming a first electrical contact on all of a top surface of the select gate; and forming a second electrical contact on only a portion of a top surface of the control gate. The method may further comprise forming the first dielectric layer, the layer of select gate material, the second dielectric layer and the third dielectric layer above the drain at a desired location; and etching the first dielectric layer, the layer of select gate material, the second dielectric and the third dielectric layer from between the select gate material and the drain to precisely determine a length of a control gate formed by the control gate material.

Also described is a method of forming a split gate memory cell. The method includes providing a semiconductor substrate. The method further includes patterning a first dielectric layer, a layer of select gate material, a second dielectric layer and a third dielectric layer to form a first stack and a second stack overlying the semiconductor substrate separated by a control gate region, the first stack including a select gate having a top surface, the first stack defining a length of the select gate, a separation distance between the first stack and the second stack defining a length of a control gate. The method further includes forming the control gate in the separation between the first stack and the second stack by forming a charge storage layer adjacent an interface between the control gate and each of the semiconductor substrate and select gate and forming a control gate material overlying the charge storage layer. The method further includes recessing the control gate material by an amount so that a top surface thereof is lower than the top surface of the select gate. The method further includes forming a source and a drain in the semiconductor substrate by removing layers directly overlying the semiconductor substrate in source and drain regions adjacent the control gate and the select gate and performing an ion implant to complete formation of the split gate memory cell. The method may further comprise forming a sidewall spacer from an edge of the top surface of the select gate to the top surface of the control gate, the sidewall spacer formed overlying a portion of the charge storage layer and providing electrical isolation between the select gate and the control gate. The forming the charge storage layer of the method may further include forming a layer of nanoclusters. The forming the charge storage layer of the method may further comprise forming a tunnel dielectric layer; forming the layer of nanoclusters overlying the tunnel dielectric; and forming a fourth dielectric layer overlying the layer of nanoclusters. The method may further include a first electrical contact on all of the top surface of the select gate; and forming a second electrical contact on only a portion of the top surface of the control gate Further a method of forming a split gate memory cell is disclosed. The method includes providing a semiconductor substrate. The method further includes forming a select gate overlying the semiconductor substrate, the select gate comprising a predetermined height and electrically insulated from the semiconductor substrate. The method further includes subsequently forming a charge storing layer overlying and adjacent to the select gate. The method further includes subsequently forming a control gate adjacent to and separated from the select gate by the charge storing layer, the charge storing layer also positioned between the control gate and the semiconductor substrate, the control gate initially having a height greater than the predetermined height of the select gate. The method further includes recessing the control gate to a control gate height that is less than the predetermined height of the select gate and no greater than 1,500 Angstroms. The method further includes forming a source and a drain in the semiconductor substrate. The method may further include forming a sidewall spacer from an edge of a top surface of the select gate to a top surface of the control gate, the sidewall spacer formed overlying a portion of the charge storage layer and providing electrical isolation between the select gate and the control gate. The forming the charge storage layer of the method may further include forming a layer of nanoclusters. The forming the charge storage layer of the method may further include forming a tunnel dielectric layer; forming the layer of nanoclusters overlying the tunnel dielectric; and forming a fourth dielectric layer overlying the layer of nanoclusters. The method may further comprise forming a first electrical contact that contacts all of a top surface of the select gate; and forming a second electrical contact that contacts only a portion of a top surface of the control gate. The forming the control gate of the method may further comprise forming the control gate by depositing a control gate material to an initial height substantially greater than the predetermined height of the select gate; and planarizing the control gate material to an intermediate height prior to said recessing. The method may further include forming the predetermined height of the select gate to have a value which implements a maximum amount of desired select gate resistance and being taller than the control gate by an amount that permits a sidewall spacer to extend from a side of the select gate to a top surface of the control gate to electrically insulate contacts to the control gate and the select gate. The method may further include forming the control gate with a precise gate length by forming first and second stacks each comprising a first dielectric layer, an overlying layer of gate material, an overlying second dielectric layer and an overlying third dielectric layer, the precise gate length being determined by a separation distance between the first and second stacks.

Although the invention is described herein with reference to specific embodiments, various modifications and changes can be made without departing from the scope of the present invention as set forth in the claims below. For example, in some cases a particular layer was called by a composition such as nitride but another material may also be effective. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of forming a split gate memory cell comprising:
   providing a semiconductor substrate;
   providing a first dielectric layer overlying the semiconductor substrate;
   providing a layer of select gate material overlying the first dielectric layer;
   providing a second dielectric layer overlying the layer of select gate material;
   providing a third dielectric layer overlying the second dielectric layer;
   providing a patterned mask material overlying the third dielectric layer to mask a select gate region and expose an immediately adjacent control gate region, the patterned mask material defining a region for a source and a drain in the semiconductor substrate;
   removing the first dielectric layer, the layer of select gate material, the second dielectric layer and the third dielectric layer in the control gate region;
   forming a charge storage layer on exposed surfaces;
   forming a layer of control gate material;
   planarizing the layer of control gate material to expose the third dielectric region in the select gate region and thereby remove the charge storage layer from an upper surface of the select gate region to expose the select gate material and the control gate material;
   removing a portion of the control gate material to recess a height of the control gate material and forming a differential in height between the control gate material and the select gate material, said removing causing the select gate material to have a greater height than the control gate material;
   removing a second portion of the charge storage layer to leave the charge storage layer between the control gate material and both the select gate material and the semiconductor substrate; and
   forming a source and a drain in the semiconductor substrate by removing layers directly overlying the semiconductor substrate in source and drain regions adjacent the control gate material and the select gate material and performing an ion implant to complete formation of the split gate memory cell.

2. The method of claim 1 further comprising:
   forming a sidewall spacer from an edge of a top surface of the select gate material to a top surface of the control gate material, the sidewall spacer formed overlying a portion of the charge storage layer and providing electrical isolation between the select gate material and the control gate material.

3. The method of claim 1 further comprising:
   forming the charge storage layer as a layer of nanoclusters.

4. The method of claim 3 wherein forming the charge storage layer further comprises:
   forming a tunnel dielectric layer;
   forming the layer of nanoclusters overlying the tunnel dielectric; and
   forming a fourth dielectric layer overlying the layer of nanoclusters.

5. The method of claim 1 wherein forming the layer of control gate material further comprises:
- forming a portion of the layer of control gate material overlying the region for the source in the semiconductor substrate;
- reducing the portion of the layer of control gate material overlying the region for the source in the semiconductor substrate to the height of the control gate material when removing the portion of the control gate material to recess the height to be no greater than 1,500 Angstroms; and
- subsequently completely removing the portion of the layer of control gate material overlying the region for the source in the semiconductor substrate.

6. The method of claim 1 further comprising:
- forming a first electrical contact on all of a top surface of the select gate; and
- forming a second electrical contact on only a portion of a top surface of the control gate.

7. The method of claim 1 further comprising:
- forming the first dielectric layer, the layer of select gate material, the second dielectric layer and the third dielectric layer above the drain at a desired location; and
- etching the first dielectric layer, the layer of select gate material, the second dielectric and the third dielectric layer from between the select gate material and the drain to precisely determine a length of a control gate formed by the control gate material.

* * * * *